United States Patent
Joppen et al.

(10) Patent No.: US 9,744,763 B2
(45) Date of Patent: Aug. 29, 2017

(54) METHOD FOR JETTING DROPLETS OF AN ELECTRICALLY CONDUCTIVE FLUID

(71) Applicant: OCÉ-TECHNOLOGIES B.V., Venlo (NL)

(72) Inventors: Sandor H. G. Joppen, Grubbenvorst (NL); Hermanus M. A. Wijshoff, Grevenbicht (NL)

(73) Assignee: OCÉ-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/978,771

(22) Filed: Dec. 22, 2015

(65) Prior Publication Data
US 2016/0107441 A1     Apr. 21, 2016

Related U.S. Application Data
(63) Continuation of application No. PCT/EP2014/064637, filed on Jul. 8, 2014.

(30) Foreign Application Priority Data
Jul. 11, 2013   (EP) .................................... 13176163

(51) Int. Cl.
| | |
|---|---|
| *B41J 2/14* | (2006.01) |
| *B41J 2/06* | (2006.01) |
| *H05K 3/10* | (2006.01) |
| *B22F 9/08* | (2006.01) |
| *B22F 5/00* | (2006.01) |

(52) U.S. Cl.
CPC ........ *B41J 2/14* (2013.01); *B22F 9/08* (2013.01); *B41J 2/06* (2013.01); *H05K 3/10* (2013.01); *B22F 2005/004* (2013.01); *B22F 2009/084* (2013.01); *B22F 2009/0892* (2013.01); *B22F 2999/00* (2013.01); *B41J 2202/04* (2013.01); *H05K 2203/104* (2013.01); *H05K 2203/105* (2013.01); *H05K 2203/128* (2013.01)

(58) Field of Classification Search
None
See application file for complete search history.

(56) References Cited

U.S. PATENT DOCUMENTS

| | | | | | |
|---|---|---|---|---|---|
| 5,377,961 | A | * | 1/1995 | Smith ...................... | B23K 3/06 222/590 |
| 5,876,615 | A | * | 3/1999 | Predetechensky ...... | B05B 5/025 222/590 |
| 6,202,734 | B1 | * | 3/2001 | Sackinger ............... | B22F 3/115 164/271 |

FOREIGN PATENT DOCUMENTS

WO    WO 2010/063576 A1    6/2010

* cited by examiner

*Primary Examiner* — Matthew Luu
*Assistant Examiner* — Tracey McMillion
(74) *Attorney, Agent, or Firm* — Birch, Stewart, Kolasch & Birch, LLP

(57) ABSTRACT

In a method for jetting a droplet of an electrically conductive fluid, a Lorentz force is generated in the electrically conductive fluid. The Lorentz force is directed into an actuation direction. The actuation direction is a direction opposite to the droplet ejection direction. A jetting device is provided for printing a droplet of an electrically conductive fluid.

7 Claims, 3 Drawing Sheets

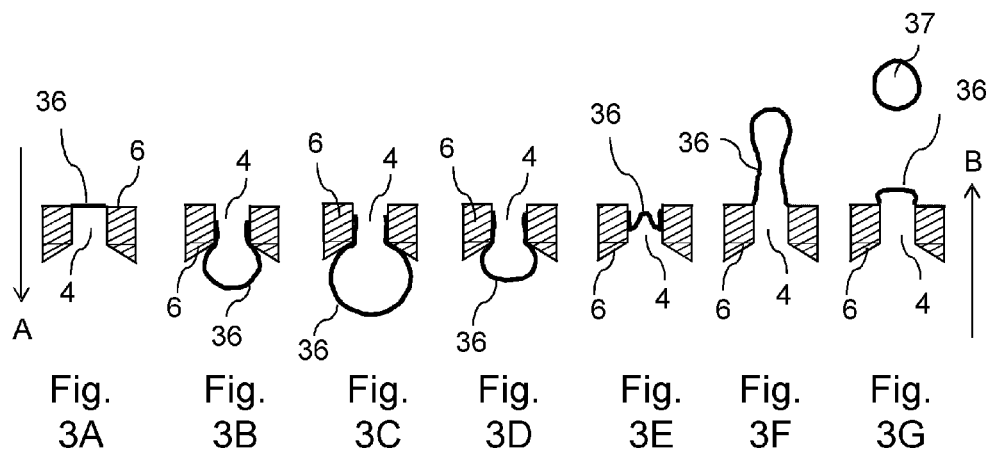
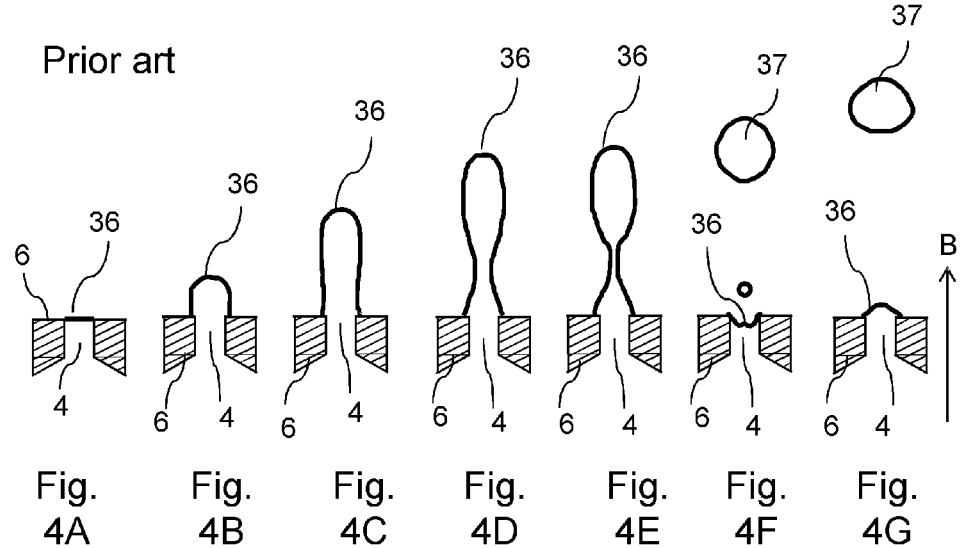

METHOD FOR JETTING DROPLETS OF AN ELECTRICALLY CONDUCTIVE FLUID

CROSS REFERENCE TO RELATED APPLICATIONS

This application is a Continuation of PCT International Application No. PCT/EP2014/064637, filed on Jul. 8, 2014, which claims priority under 35 U.S.C. 119(a) to Patent Application No. 13176163.7, filed in Europe on Jul. 11, 2013. The entire contents of each of the above-identified applications are expressly incorporated by reference into the present application.

The present invention relates to a method for jetting a droplet of an electrically conductive fluid. The present invention further relates to a jetting device for printing a droplet of an electrically conductive fluid.

BACKGROUND OF THE INVENTION

A jetting device for ejecting droplets of an electrically conductive fluid, such as a molten metal or a molten semiconductor is known. An example of a jetting device for ejecting droplets of an electrically conductive fluid is described in WO 2010/063576 A1. In such a printing device, a Lorentz force is generated in the electrically conductive fluid due to which a droplet is expelled through an orifice nozzle of the printing device. Such a device may be used for ejecting droplets of a fluid having a high temperature, for example a molten metal having a high melting point.

Direct printing of molten metal may be employed for printing electronic circuitry, for example. There is a tendency to make electronic circuits as small as possible.

To make small circuits by printing, it is desired to build the circuit from small droplets. However, it may be difficult to adapt the size of the droplet ejected from jetting device for ejecting droplets of an electrically conductive fluid, without changing the geometry and size of the ink chamber and the nozzle.

In addition, ejecting droplets of an electrically conductive fluid, which may have high melting points, requires a lot of energy.

Furthermore, it is desired to have an alternative method for jetting a droplet of an electrically conductive fluid available.

It is an object of the invention to provide a method for ejecting droplets of an electrically conductive fluid that mitigates at least one of the above problems.

SUMMARY OF THE INVENTION

The above object is achieved in a method for jetting a droplet of an electrically conductive fluid using a jetting device, the jetting device comprising a fluid chamber body defining a fluid chamber and having an orifice operatively coupled to the fluid chamber for ejecting a droplet in a droplet ejection direction, and an actuation means, the actuation means comprising:

a magnetic field generating means for generating a magnetic field in at least a part of the fluid chamber; and
an electrical current generating means for generating an electrical current in the electrically conductive fluid in the part of the fluid chamber provided with the magnetic field, the method comprising the step of:

a) applying an electrical current to the electrically conductive fluid positioned in the magnetic field, thereby generating a Lorentz force in the electrically conductive fluid, the Lorentz force being directed in an actuation direction, the actuation direction being in an opposite direction compared to the droplet ejection direction;

as a result of the Lorentz force generated in step a), ejecting a droplet of the electrically conductive fluid in the droplet ejection direction.

In a known system for printing an electrically conductive fluid, a droplet of said electrically conductive fluid is expelled through an orifice by a Lorentz force. This force causes a motion in the conductive fluid. This motion may generate a droplet of the fluid. The Lorentz force is related to the electric current and the magnetic field vector; $\vec{F} = \vec{I} \times \vec{B}$. The Lorentz force resulting from the electric current and the magnetic field is generated in a direction perpendicular to both the electrical current and the magnetic field. By suitably selecting the direction and the magnitude of the electric current, as well as the direction and the magnitude of the magnetic field, the direction and the magnitude of the resulting Lorentz force may be selected.

To generate a suitable Lorentz force, the jetting device in accordance with the present invention may comprise actuation means. The actuation means may comprise a magnetic field generating means for generating a magnetic field in at least a part of the fluid chamber. The magnetic field generating means may be e.g. a magnet. In addition, the actuation means may comprise electrical current generating means for generating an electrical current in the electrically conductive fluid in the part of the fluid chamber provided with the magnetic field. The electrical current generating means may comprise an electrode. The electrical current generating means may be in electrical contact with the electrically conductive fluid. In the system in accordance with the present invention, in normal operation, the magnetic field is provided and an electrical current is provided in the conductive fluid, such that a suitable force for ejecting a droplet is generated. The jetting device in accordance with the present invention comprises a fluid chamber and has an orifice extending from the fluid chamber to an outer surface of the fluid chamber element. The orifice is operatively coupled to the fluid chamber. In operation, the fluid chamber comprises an electrically conductive fluid. When applying an actuation pulse, a Lorentz force is generated within the fluid, causing the fluid to move through the orifice in a direction away from the fluid chamber. The actuation pulse may be applied by applying a pulsed magnetic field and a continuous electrical current, or a pulsed electrical current in a continuous magnetic field, or a combination thereof.

In the method according to the present invention, in step a), an electrical current may be applied to the electrically conductive fluid positioned in the magnetic field, thereby generating a Lorentz force in the electrically conductive fluid, the Lorentz force being directed in an actuation direction, the actuation direction being in an opposite direction compared to the droplet ejection direction. The electrical current may be an electrical current pulse, which is applied to the electrically conductive fluid positioned in the magnetic field. Alternatively, the electrical current may be a constant current and the magnetic field may be a pulsed magnetic field. In an even further alternative, both the electrical current and the magnetic field may be pulsed.

The pulse width of the actuation pulse may be optimized for the process parameters, such as temperature of the fluid, type of the electrical conductive fluid, size and geometry of the orifice, size and geometry of the fluid chamber, etc. The person skilled in the art will thus understand that an actuation pulse may be suitably selected based on the process parameters, such as the process parameters mentioned above.

By applying the electrical current to the electrically conductive fluid positioned in the magnetic field, an actuation pulse is applied that may result in the generation of a Lorentz force in the electrically conductive fluid. As explained above, the direction of the Lorentz force depends on the direction of the electrical current and the magnetic field. In the method according to the present invention, the Lorentz force generated may be directed in an actuation direction. The actuation direction may be in an opposite direction compared to the droplet ejection direction. The droplet ejection direction may be the direction of ejection of a droplet. The droplet may be ejected in a direction from the fluid chamber, through the nozzle to the outside of the fluid chamber body. Thus, in the method according to the present invention, the direction of the force generated in fluid may be opposite to the direction in which a droplet of the fluid is ejected. Without wanting to be bound to any theory, the mechanism for generating a droplet is believed to be as follows. By generating a Lorentz force in the electrically conductive fluid in the actuation direction, the electrically conducive fluid positioned in the magnetic field may move in the actuation direction. As a result, the meniscus of the electrically conductive fluid may retract away from the orifice toward the interior of the fluid chamber; i.e. the meniscus of the electrically conductive fluid may retract in a meniscus retraction direction. When the electrical current and/or the magnetic field stop, no more Lorentz force may be generated in the electrically conductive fluid. As a result, the meniscus of the fluid may stop retracting. The retracted meniscus may experience a pressure, for example caused by the surface tension at the surface of the meniscus. Because of this force, the fluid may be accelerated and the meniscus may move from the retracted position towards the orifice (i.e. the meniscus may move in the droplet ejection direction). The droplet ejection direction may be an opposite direction compared to the meniscus retraction direction. Thus, the movement of the meniscus of the fluid may resemble the movement of the elastic strip(s) of a slingshot. The electrically conductive fluid may be easily deformable. When the meniscus moves in the droplet ejection direction, the meniscus may deform and a droplet of the electrically conductive fluid may be ejected through the orifice. The size of the droplet may be relatively small. The speed of the droplet may be relatively high. As mentioned above, in the method according to the present invention, the fluid is actuated by generating a Lorentz force in the fluid by applying an electrical current to the electrically conductive fluid positioned in a magnetic field. Unlike other ink jet actuation techniques, such as thermal ink jet and piezoelectric actuation, when using Lorentz actuation a force is generated in the fluid itself.

Therefore, using Lorentz actuation may be suitably used to eject a droplet of fluid in the droplet ejection direction by generating a force in the fluid that has a direction opposite to the droplet ejection direction. Only the Lorentz force that result in retraction of the meniscus has to be applied to the fluid. Thus, for ejecting a droplet, it may suffice that an external force is applied to the fluid once.

For example, in thermal inkjet, a droplet of fluid is ejected by locally heating the fluid and creating a gas bubble in the fluid. Thus, using thermal inkjet it is not possible to actuate a fluid such that the meniscus retracts. When using piezoelectric actuation, fluid is actuated by expansion and compression of an ink chamber comprising the fluid. A piezoelectric element may flux upon actuation and a volume change may occur in the ink chamber. The volume change in the fluid chamber may result in a pressure change in the fluid, which may lead to a movement of the fluid. When using piezoelectric actuation, it may be possible to retract the meniscus of the fluid by increasing the volume of the fluid chamber. The fluid may experience a driving force due to which the meniscus moves back towards its original position and possibly a droplet may be expelled. However, because a compression of the fluid chamber was needed to retract the nozzle, the fluid chamber is deformed with regard to the situation before actuation. In order to apply a second actuation, the fluid chamber may need to be brought back into its original state before a subsequent droplet may be ejected. Thus, when using piezoelectric actuation, it may not be possible to eject a series of droplets by just retracting the nozzle in a direction opposite to the droplet ejection direction. After retracting the meniscus of the fluid, an external force may need to be applied to allow the fluid chamber to return to its initial state. Instead, when using Lorentz actuation, the force for putting the fluid and the meniscus into motion is generated in the fluid itself; it is not a result of a volume change in the fluid chamber. In the method according to the present invention, after the meniscus has retracted due to the Lorentz force generated in the fluid, the fluid may move into the droplet ejection direction without the need of applying an external force. In addition, no force may have to be provided to the fluid chamber to allow the fluid chamber to return to its initial state, because no volume change has occurred in the fluid chamber upon actuating the fluid. Thus, the fluid may be suitably actuated by applying the method according to the present invention.

In an embodiment, at least an inner surface of the fluid chamber body is provided with a wetting coating. The wetting coating is wettable for the fluid. Preferably, the coating is wettable by a relatively large range of fluid materials.

As explained above, upon actuation of the fluid, the meniscus of the fluid may retract away from the orifice and the meniscus may move into the fluid chamber. When the electrical current and/or the magnetic field generating the Lorentz force is stopped, the meniscus of the electrically conductive fluid may stop moving into the fluid chamber and may start moving backwards towards the orifice. When moving towards the orifice, the fluid may need to move over an inner surface of the fluid chamber body and may come into contact with the inner surface. If the inner surface does not have sufficient wetting property with regard to the electrically conductive fluid, then the movement of the fluid towards the orifice over the inner surface of the fluid chamber may be hampered, making the droplet ejection less efficient. If the inner surface of the fluid chamber body is provided with a wetting coating, the wetting property of the inner surface with regard to the electrically conductive fluid may be improved and the fluid may wet the inner surface of the fluid chamber, thereby facilitating the movement of the fluid over the inner surface. In that case, the ejection of a droplet may be more efficient. Thus, the presence of a wetting coating on at least an inner surface of the fluid chamber may improve efficiency of the droplet ejection according to the present invention. The coating may be provided e.g. by chemical vapor deposition (CVD).

In a further embodiment, the wetting coating comprises at least one of the group consisting of mono-tungsten-carbide (WC), di-tungsten-carbide $W_2C$), tri-tungsten-carbide ($W_3C$) and boron-nitride (BN). In a preferred embodiment, tri-tungsten-carbide (W3C) is comprised in the wetting coating. Tungsten carbide is wettable by a relatively large number of metals, including metals like gold, silver and copper (Au, Ag, Cu, respectively). In an alternative embodiment, the inner surface is provided with a metallic coating. It is known that many molten metals are wetting on a metallic surface. Consequently, a metallic coating may be a suitable coating.

In an embodiment, the electrically conductive fluid is a molten metal.

Metals are materials that in general have a good electric conductivity. For example, ejecting droplets of a molten metal may be used to print electronic circuits. By applying a printing technique to apply droplets of metal onto a receiving medium, electronic circuits may be printed in a versatile way; i.e. the shape of the circuit may be easily adapted by applying a printing technique. The method according to the present invention allows printing small droplets. By printing small droplets, small electronic circuits may be provided.

In addition, molten metals generally have a high surface tension, compared to other liquids such as water, organic solvents and conventional inkjet inks. Without wanting to be bound to any theory, the surface tension may induce the movement of the meniscus in the droplet ejection direction. The higher the surface tension, the larger may be the driving force for the meniscus to move in the droplet ejection direction and the more efficient the ejection of a droplet in the droplet ejection direction may be. Thus, molten metals may be suitably used as electrically conductive fluids in the method according to the present invention.

In a further embodiment, the molten metal is selected from the group consisting of molten silver, molten copper and molten gold.

Silver and copper may be usefully applied in electronic devices, for example as electrodes. In addition alloys comprising at least one of copper and silver may be used. By applying an image of silver, copper or an alloy thereof onto a recording medium, electrically conductive parts, such as electrodes, may be efficiently applied onto the recording medium.

In an embodiment, a method for jetting a series of droplets of the electrically conductive fluid is provided, the series of droplets comprising at least one small droplet and at least one large droplet, wherein the at least one small droplet is jetted in step a), and wherein, in step a), the actuation direction is a first actuation direction and the droplet ejected is a small droplet;

and wherein the method further comprises the step of:
b) applying an electrical current to the electrically conductive fluid positioned in the magnetic field, thereby generating a Lorentz force in the electrically conductive fluid, the Lorentz force being directed in a second actuation direction, the second actuation direction being in a direction parallel to the droplet ejection direction;

as a result of the Lorentz force generated in step b), ejecting a large droplet of the electrically conductive fluid in a the droplet ejection direction.

A series of droplets may be ejected, the series of droplets may be for example a series of droplets that form an image, when applied onto a receiving medium. Each one of the droplets of the series of droplets may be applied onto a predetermined position of the receiving medium. In this embodiment, the image may be formed by a plurality of droplets, wherein the size of the droplets is not uniform. For example, the image may be formed by at least one small droplet and at least one large droplet.

The small droplet may be formed by applying an electrical current to the electrically conductive fluid positioned in the magnetic field, such that a Lorentz force is generated that is directed in a first actuation direction, wherein the first actuation direction is in an opposite direction compared to the droplet ejection direction. As explained above, by generating a Lorentz force in a direction opposite compared to the droplet ejection direction, a droplet may be ejected in the droplet ejection direction. This droplet may be a small droplet. Optionally, the droplet ejection speed of this droplet may be high. In addition, in this embodiment in step b), an electrical current may be applied to the electrically conductive fluid positioned in the magnetic field, thereby generating a Lorentz force in the electrically conductive fluid, the Lorentz force being directed in a second actuation direction. Thus, the Lorentz force generated in the fluid in step b) has a direction different that the Lorentz force generated in the electrically conductive fluid in step a). The second actuation direction is in a direction parallel to the droplet ejection direction. Due to the generation of a Lorentz force in the second actuation direction in step b), a large droplet may be ejected. Optionally, the droplet ejection speed of the droplet generated in step b) may be low compared to the speed of the droplet generated in step a).

Thus, by varying the direction of the Lorentz force generated in the fluid, the droplet size of the ejected droplets may be varied. In addition, the speed of the droplets formed may be varied.

The relative amount of the small droplets to be ejected versus the relative amount of the large droplets to be ejected may be suitably controlled based on the image to be printed. The droplets may be ejected in any suitable order. For example, first a sub-series of small droplets may be ejected and subsequently a sub-series of large droplets may be ejected or vice-versa. A sub-series of small droplets may be ejected by carrying out step a) repeatedly, whereas a sub-series of large droplets may be ejected by carrying out step b) repeatedly. Alternatively, small droplets and large droplets may be ejected alternately by alternately performing step a) and b), respectively.

In the context of the present invention, small droplets and large droplets may not refer to absolute droplet sizes. Instead, the terms "small droplet" is meant to refer to droplets that are small compared to the "large droplets" and vice-versa. The small droplet may have a first volume and the large droplet may have a second volume, wherein the second volume is larger than the first volume.

In an aspect of the invention, a jetting device for printing a droplet of an electrically conductive fluid is provided, the jetting device comprising:
a fluid chamber body defining a fluid chamber for holding an amount of the electrically conductive fluid; and
an actuation assembly configured to expel droplets of the electrically conductive fluid from the chamber through an orifice in the droplet ejection direction, the actuation assembly comprising
a magnetic field generating unit for generating a magnetic field in at least a part of the fluid chamber; and
an electrical current generating means for generating an electrical current in the electrically conductive fluid in the part of the fluid chamber provided with the magnetic field,
wherein the jetting device further comprises:
control means configured to in operation control at least one of the electrical current and the magnetic field such that in operation at least one small droplet and/or at least one large droplet is jetted.

The jetting device according to the present invention is thus configured for performing the method according to the present invention.

The control means may be e.g. a computer. The control means may be configured to receive information from an external source, e.g. via a USB-port or via a network. The control means may e.g. receive information about a print job. The information about a print job may comprise information about an image to be printed, wherein the image may be a predetermined pattern of dots to be printed. A dot to be printed may be applied onto a receiving medium by ejecting a droplet of the electrically conductive fluid. The predetermined pattern of dots may be applied to the receiving medium by applying at least one small dot and/or at least one large dot onto the receiving medium, wherein the large dot may be formed by a large droplet and the small dot is formed by a small droplet. The control means may suitably control the magnetic field and the electrical current applied to the electrically conductive fluid to suitably actuate the fluid, such that a predetermined series of small and/or large droplets is ejected from the jetting device to form an image onto a receiving medium.

BRIEF DESCRIPTION OF THE DRAWINGS

These and further features and advantages of the present invention are explained hereinafter with reference to the accompanying drawings showing non-limiting embodiments and wherein:

FIG. 3A-FIG. 3G schematically show a first example of the method according to the present invention.

FIG. 4A-FIG. 4G schematically show a first example of a method not according to the present invention.

In the drawings, same reference numerals refer to same elements.

DETAILED DESCRIPTION OF THE DRAWINGS

Figure 1:
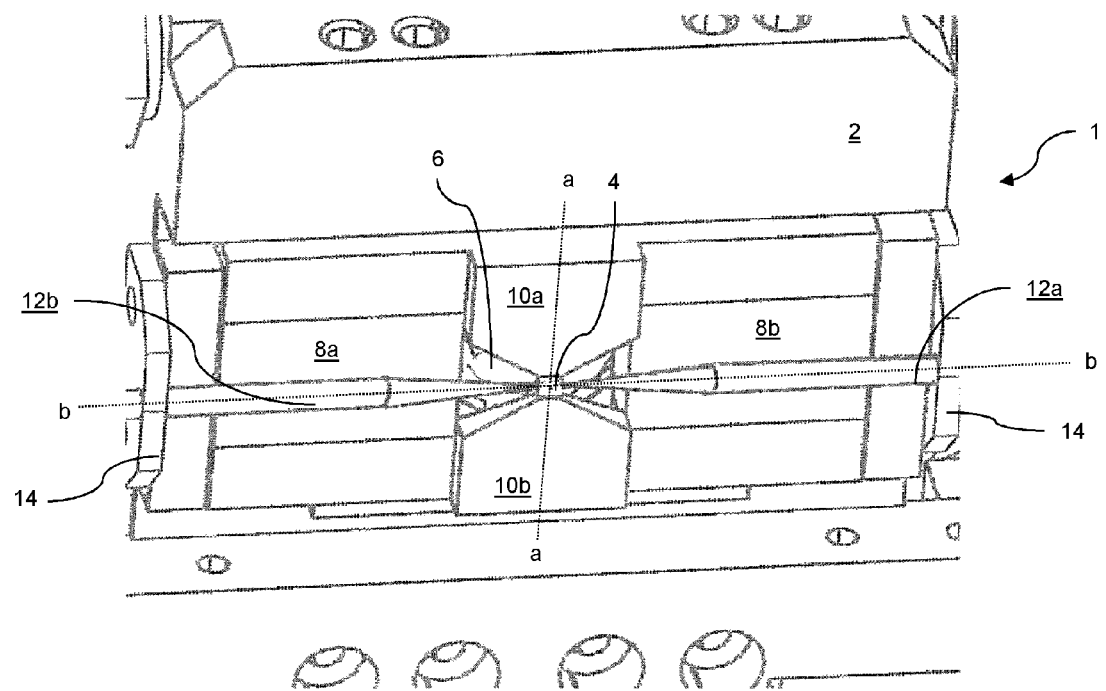
FIG. 1 shows a perspective view of a jetting device for printing droplets of an electrically conductive fluid.

FIG. 1 shows a part of a jetting device 1 for ejecting droplets of an electrically conductive fluid. The jetting device 1 is suitable for jetting a relatively hot fluid, in particular a molten metal such as copper, silver, gold and the like. The jetting device 1 comprises a support frame 2, made of a heat resistant and preferably heat conductive material.

The jetting device 1 is provided with an ejection nozzle 4 through which a droplet of the fluid may be ejected. The nozzle or orifice 4 is a through hole extending through a wall of a fluid chamber body 6. In the fluid chamber body 6 a fluid chamber is arranged. The fluid chamber is configured to hold the fluid.

For ejecting droplets of molten metal, the jetting device 1 is provided with two permanent magnets 8a, 8b (hereinafter also referred to as magnets 8). The magnets 8 are arranged between two magnetic field concentrating elements 10a, 10b (hereinafter also referred to as concentrators 10) made of magnetic field guiding material such as iron. The jetting device 1 is further provided with two electrodes 12a, 12b (hereinafter also referred to as electrodes 12) both extending into the fluid chamber body 6 through a suitable through hole such that at least a tip of each of the electrodes 12 is in direct electrical contact with the molten metal present in the fluid chamber. The electrodes 12 are supported by suitable electrode supports 14 and are each operatively connectable to suitable electrical current generators (not shown) such that a suitable electrical current may be generated through the electrodes 12 and the molten metal present between the tips of the electrodes 12.

Figure 2:
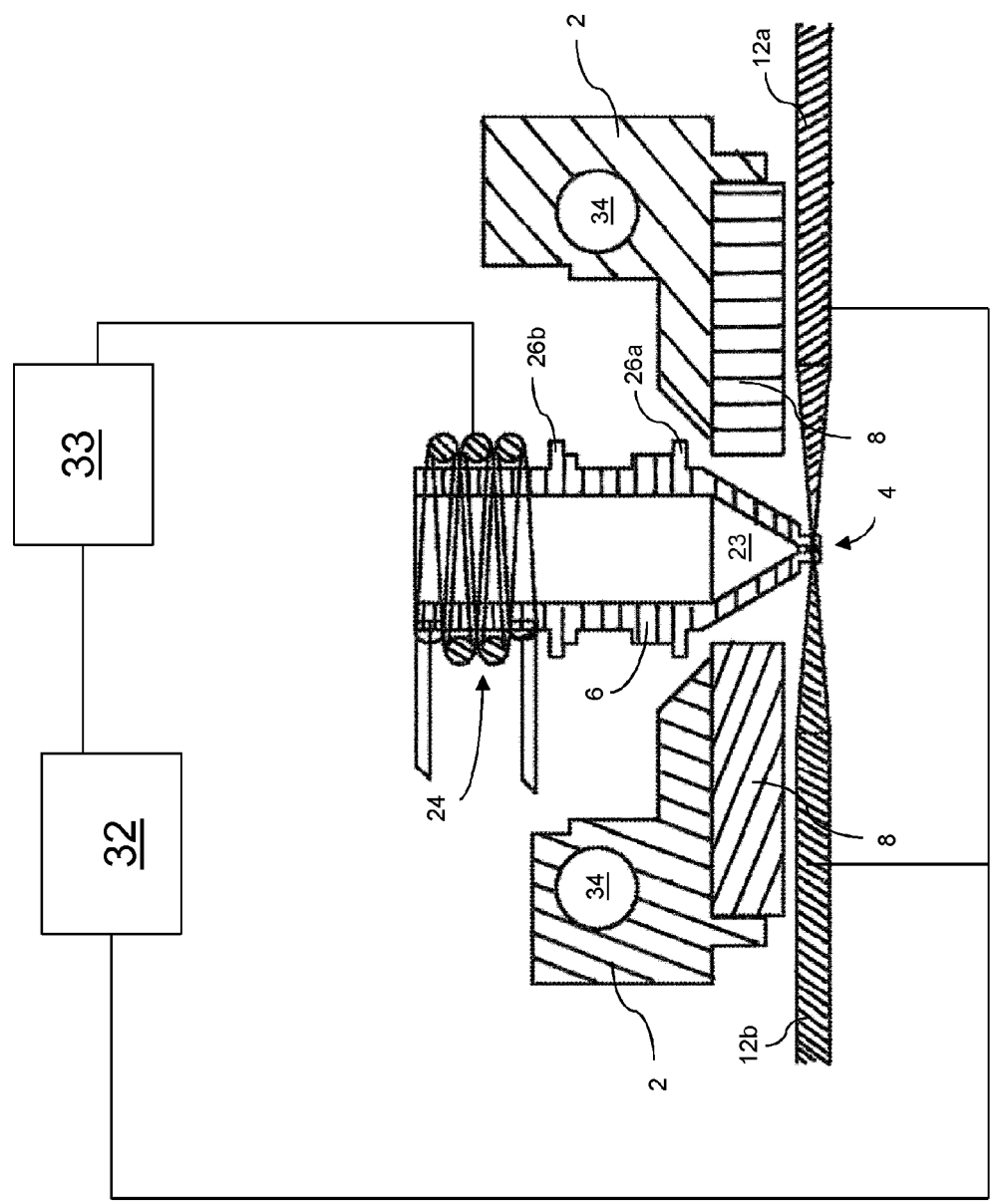
FIG. 2 shows a cross-sectional view of a part of the jetting device shown in FIG. 1.

FIG. 2 shows a cross-section of the embodiment illustrated in FIG. 1, which cross-section is taken along line b-b (FIG. 1). Referring to FIG. 2, the support frame 2 and the magnets 8 are shown. In the illustrated embodiment, the support frame 2 is provided with cooling channels 34 through which a cooling liquid may flow for actively cooling of the support frame 2 and the magnets 8. An induction coil 24 is shown. The fluid chamber body 6 is arranged in a center of the induction coil 24 such that a current flowing through the induction coil 24 results in heating of a metal arranged in the fluid chamber 6. Due to such heating the metal may melt and thus become a fluid. Such inductive heating ensures a power-efficient heating and no contact between any heating element and the fluid, limiting a number of (possible) interactions between elements of the jetting device 1 and the fluid. Nevertheless, in other embodiments, other means for heating the metal in the fluid chamber may be applied. The presence of the induction coil may help in controlling the temperature of the fluid in a position away from the orifice 4. Also, it may be useful to heat the fluid using the induction coil 24, for example at start up of the jetting device, when the electrically conductive material is molten to become an electrically conductive fluid.

The jetting device 1 further comprises a control unit 33. The control means 33 is operatively connected to the electrical current generating unit 32. The electrical current generating unit may preferably be an electrical direct current generating unit. Non-limiting examples of suitable electrical direct current generating units are batteries, solar cells and dynamos. In the embodiment shown in FIG. 2, the electrical current generating unit 32 is connected to electrodes 12. Thus, the electrical current generated by the electrical current generating unit 32 can be applied to the fluid present in the actuation chamber 23 through the electrodes 12. The amount of electrical current supplied to the fluid via the electrodes a may be controlled by control means 33. The electrical current may be applied as an electrical current pulse. The shape, amplitude and pulse width of the electrical current pulse may be suitably controlled by the control means 33.

FIG. 3A-3G schematically show the actuation of an electrically conductive fluid using a method according to the present invention. FIG. 3A shows the situation at the start of the actuation of the electrically conductive fluid. The orifice 4 is completely filled with the fluid. The meniscus 36 of the electrically conductive fluid is essentially flat and does not extend substantially beyond the orifice 4. The orifice 4 is confined by the fluid chamber body 6. For clarity reasons, not the entire fluid chamber body is depicted in FIGS. 3A-3G, but only a part of the fluid chamber body 6 surrounding the orifice 4. FIG. 3B shows the situation after an electrical current has been applied to the electrically conductive fluid. The electrically conductive fluid is positioned in a magnetic field. Due to the electrical current, a Lorentz force was generated in the fluid. Consequently, as is shown in FIG. 3B, the meniscus 36 of the electrically conductive fluid has retracted and has moved into the fluid chamber. Thus, the meniscus of the fluid has moved in the direction of actuation, which is a meniscus retraction direction A. In FIG. 3C, the meniscus has retracted even further, compared to the situation according to FIG. 3B. Even if the electrical current and/or the magnetic field is stopped, the meniscus may retract further. Because of inertia, the fluid may not stop moving immediately once the Lorentz force has stopped. Stopping the movement may take a certain period of time. However, once the retraction has stopped, the meniscus may start moving back towards the orifice 4. There is no need to provide a Lorentz force to the electrically conductive fluid to bring about the movement of the meniscus in the direction of the orifice 4. Without wanting to be bound to any theory, it is believed that the surface tension in the retracted meniscus 36, that has an enlarged surface compared to the meniscus 36 as shown in FIG. 3A, provides the fluid with a driving force to move. The driving force may be such that the meniscus 36 does not just move back to its original position, but it may also move to a position outside of the orifice. In FIG. 3D-3F, it is shown how the meniscus 36 gradually moves in a direction opposite to the actuation direction. This direction opposite to the actuation direction is the droplet ejection direction B. In the situation shown in FIG. 3F, the meniscus 36 has moved to a position that extends beyond the fluid chamber 6. As a result of this movement, a droplet 37 is formed, because the meniscus may break at a certain point. As is shown in FIG. 3G, the droplet is formed. This droplet moves in the droplet ejection direction B. The droplet may be relatively small. The droplet may move relatively fast. After the droplet has been formed, the meniscus 36 of the fluid may retract towards the orifice 4. After a certain time interval, the meniscus 36 may return to a rest-position, i.e. the position as shown in FIG. 3A.

FIG. 4A-4G schematically show the actuation of an electrically conductive fluid using a method not according to the present invention. FIG. 4A shows the situation at the start of the actuation of the electrically conductive fluid. The orifice 4 is completely filled with the fluid. The meniscus 36 of the electrically conductive fluid is essentially flat and does not extend substantially beyond the orifice 4. The orifice 4 is confined by the fluid chamber body 6. For clarity reasons, not the entire fluid chamber body is depicted in FIGS. 4A-4G, but only a part of the fluid chamber body 6 surrounding the orifice 4. FIG. 4B shows the situation after an electrical current has been applied to the electrically conductive fluid. The electrically conductive fluid is positioned in a magnetic field. Due to the electrical current, a Lorentz force was generated in the fluid. In this case, a Lorentz force was generated in the direction of droplet ejection. Consequently, as is shown in FIG. 4B, the meniscus 36 of the electrically conductive fluid has moved to a position outside of the orifice. Thus, the meniscus 36 of the fluid has moved in a droplet ejection direction B. Consequently, in the method not according to the present invention, the Lorentz force is generated in a direction parallel to the droplet ejection direction. The actuation pulse may stop when the meniscus 36 is in the position as depicted in FIG. 4B. However, even if the electrical current and/or the magnetic field is stopped, the meniscus 36 may extent further beyond the orifice. Because of inertia, the fluid may not stop moving immediately once the force has stopped. Stopping the movement may take a certain period of time. As is shown in FIG. 4C-4E, the meniscus 36 may move further in the droplet ejection direction. At a certain point, as is depicted in FIG. 4F, the meniscus 36 may break and a droplet 37 may be formed. When the droplet 37 has been formed, the meniscus 36 may retract towards the orifice 4. As is shown in FIG. 4G, the droplet 37 continues moving in the droplet ejection direction. After the droplet 37 has formed, the meniscus 36 of the fluid may vibrate. Due to friction, the meniscus 36 will stop moving after a certain time interval and may return to its initial position, as depicted in FIG. 4A. The droplet 37 ejected according to the method shown in FIG. 4A-4G may be relatively large. The velocity of the droplet 37 may be relatively low.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually and appropriately detailed structure. In particular, features presented and described in separate dependent claims may be applied in combination and any combination of such claims are herewith disclosed. Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention claimed is:

1. A method for jetting a droplet of an electrically conductive fluid using a jetting device, the jetting device comprising a fluid chamber body defining a fluid chamber and having an orifice operatively coupled to the fluid chamber for ejecting a droplet in a droplet ejection direction, and an actuator, the actuator comprising:
   a magnetic field generator configured to generate a magnetic field in at least a part of the fluid chamber; and
   an electrical current generator configured to generate an electrical current in the electrically conductive fluid in the part of the fluid chamber provided with the magnetic field,
   the method comprising the steps of:
   a) applying an electrical current to the electrically conductive fluid positioned in the magnetic field to generate a Lorentz force in an actuation direction that is an opposite direction compared to the droplet ejection direction,
   wherein the Lorentz force is such that the electrically conductive fluid is retracted in the actuation direction and moved into the fluid chamber, and
   b) as a result of the Lorentz force generated in step a), ejecting a droplet of the electrically conductive fluid in the droplet ejection direction.

2. The method according to claim 1, wherein at least an inner surface of the fluid chamber body is provided with a wetting coating.

3. The method according to claim 2, wherein the wetting coating comprises at least one of the group consisting of mono-tungsten-carbide (WC), di-tungsten-carbide $W_2C$), tri-tungsten-carbide ($W_3C$) and boron-nitride (BN).

4. The method according to claim 1, wherein the electrically conductive fluid is a molten metal.

5. The method according to claim 4, wherein the molten metal is selected from the group consisting of molten silver, molten copper and molten gold.

6. The method according to claim 1 for jetting a series of droplets of the electrically conductive fluid, the series of droplets comprising at least one small droplet and at least one large droplet, wherein the at least one small droplet is jetted in step a), and wherein, in step a), the actuation direction is a first actuation direction and the droplet ejected is a small droplet, and wherein the method further comprises the step of:

c) applying an electrical current to the electrically conductive fluid positioned in the magnetic field, thereby generating a Lorentz force in the electrically conductive fluid, the Lorentz force being directed in a second actuation direction, the second actuation direction being in a direction parallel to the droplet ejection direction, as a result of the Lorentz force generated in step c), ejecting a large droplet of the electrically conductive fluid in the droplet ejection direction.

7. A jetting device for printing a droplet of an electrically conductive fluid, the jetting device comprising:

a fluid chamber body defining a fluid chamber for holding an amount of the electrically conductive fluid;

an actuation assembly configured to expel droplets of the electrically conductive fluid from the chamber through an orifice in the droplet ejection direction, the actuation assembly comprising a magnetic field generator configured to generate a magnetic field in at least a part of the fluid chamber; and an electrical current generator configured to generate an electrical current in the electrically conductive fluid in the part of the fluid chamber provided with the magnetic field; and a controller configured to control at least one of the electrical current and the magnetic field to generate a Lorentz force in an actuation direction that is an opposite direction compared to the droplet ejection direction, wherein the Lorentz force is such that the electrically conductive fluid is retracted in the actuation direction and moved into the fluid chamber, and a result of the generated Lorentz force is at least one droplet being jetted in the droplet ejection direction.

* * * * *